United States Patent [19]

Khan et al.

[11] Patent Number: 4,616,248

[45] Date of Patent: Oct. 7, 1986

[54] UV PHOTOCATHODE USING NEGATIVE ELECTRON AFFINITY EFFECT IN $AL_xGA_{1-x}N$

[75] Inventors: M. Asif Khan, Burnsville; Richard G. Schulze, Hopkins, both of Minn.

[73] Assignee: Honeywell Inc., Minneapolis, Minn.

[21] Appl. No.: 735,928

[22] Filed: May 20, 1985

[51] Int. Cl.⁴ ...................... H01L 27/14; H01L 31/00

[52] U.S. Cl. .......................................... 357/30; 357/4; 357/61

[58] Field of Search .......................... 357/30, 61, 16, 4

[56] References Cited

U.S. PATENT DOCUMENTS

| | | | |
|---|---|---|---|
| 3,575,628 | 4/1971 | Wond | 357/30 |
| 3,971,943 | 7/1976 | Jeunehomme et al. | 250/372 |
| 4,000,503 | 12/1976 | Matare | 357/30 |

*Primary Examiner*—James W. Davie

*Assistant Examiner*—Georgia Y. Epps

*Attorney, Agent, or Firm*—Omund R. Dahle

[57] ABSTRACT

A high efficiency UV responsive negative electron affinity photocathode with the long wavelength cutoff tunable over the wavelength from ~200 to ~300 nm based on $Al_xGa_{1-x}N$. Negative electron affinity photocathodes for sharply enhanced photoemission yield can be formed by applying a layer of cesium to the surface of $Al_xGa_{1-x}N$ for which the Fermi energy level is appropriately positioned.

4 Claims, 2 Drawing Figures

UV PHOTOCATHODE USING NEGATIVE ELECTRON AFFINITY EFFECT IN $AL_xGA_{1-x}N$

BACKGROUND AND SUMMARY OF THE INVENTION

The invention is directed to a high efficiency ultraviolet (UV) responsive negative electron affinity photocathode with the long wavelength cutoff tunable over the wavelength from ~200 to ~360 nm based on $Al_xGa_{1-x}N$.

The III-V semiconductor alloy system $Al_xGa_{1-x}N$ has several important potential advantages as a UV photocathode material:

- The long wavelength cutoff can be varied from ~200 nm to ~360 nm.
- It has a very large absorption coefficient
- The photoelectron emission quantum efficiency is higher than homogenous solids because of the ability to tailor the electronic band structure near the surface with the use of heterostructures.
- Negative electron affinity photocathodes, for sharply enhanced photoemission yield, can be formed by applying a layer of cesium to the surface of $Al_xGa_{1-x}N$ for which the Fermi energy level is appropriately positioned.
- It can be configured as a transmission photocathode or a front side illuminated photocathode.

$Al_xGa_{1-x}N$ is a direct bandgap semiconductor which can be grown in single crystal form on sapphire substrate. It will not be sensitive to visible radiation since it has a well defined long wavelength absorption edge characteristic of a direct bandgap semiconductor. The measured optical absorbance shows an increase of 4 orders of magnitude over a wavelength range of approximately 20 nm at the absorption edge.

$Al_xGa_{1-x}N$ is an alloy of AlN and GaN. The composition of the alloy can easily be varied during growth. By varying the composition, x, the bandgap and hence the long wavelength absorption edge can be varied from ~200 nm to ~360 nm. Other commonly used photocathode materials such as CsTe have a fixed absorption edge which may not be a good match for some applications. The control of aluminum composition is achieved simply by the mass flow control of hydrogen through the Ga and Al metal organic sources during growth.

Thus the ability to tailor the band shapes at or near the surface provides an attractive degree of freedom in enhancing photoelectron escape probability.

$Al_xGa_{1-x}N$ has a very large absorption coefficient characteristic of direct bandgap semiconductors such as GaAs. In fact the absorption coefficient in $Al_xGa_{1-x}N$ is expected to rise even more sharply near the edge than in GaAs since the electron effective mass and hence the density of states is larger. In contrast, the amorphous photocathode materials typically have a relatively soft absorption edge.

DESCRIPTION

This invention describes a UV detector which is formed in aluminum gallium nitride ($Al_xGa_{1-x}N$) and the process of fabricating the device. In order to have a sharp wavelength cut-off feature the active material should be a single crystal semiconductor in which direct intrinsic bandgap absorption sets in very abruptly. The $Al_xGa_{1-x}N$ system is a preferred choice because it has a bandgap range which lies in the ultra-violet range of energies and because the spectral response can be tailored to the application by varying the aluminum to gallium ratio. AlGaN has been grown by MOCVD in the compositional range required to produce detectors having peak sensitivities between ~360 nm and ~200 nm. The MOCVD process is well adapted to the growth of aluminum-gallium alloy systems because the ratio of aluminum to gallium can be easily controlled.

Figure 1:
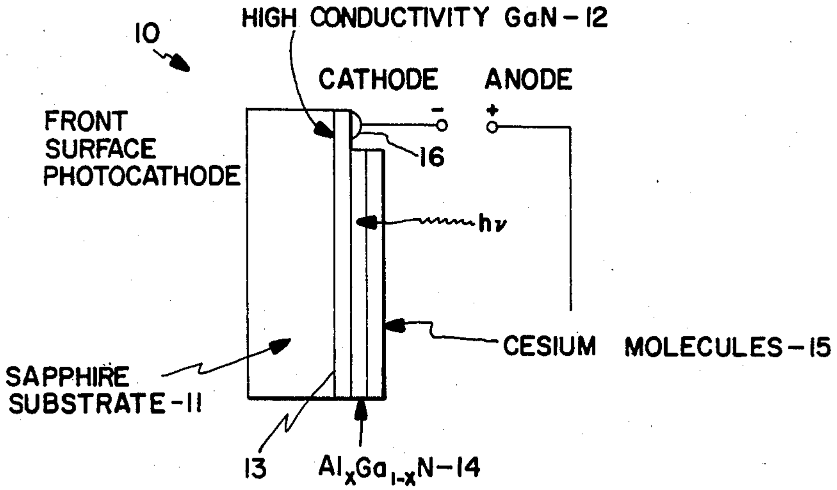
FIG. 1 is a pictorial view of the layer structure of a front-surface UV photocathode according to the invention.

Referring now to FIG. 1 there is shown a high efficiency UV photocathode 10 having a basal plane sapphire ($Al_2O_3$) substrate 11. In preparing the device the substrate is loaded into a metalorganic chemical vapor deposition (MOCVD) reactor and heated such as by rf induction. Then using high purity hydrogen as a carrier gas, ammonia and a gallium metal organic such as trietheyl gallium are introduced into the growth chamber and epitaxial growth continues for a suitable period resulting in a single crystalline high conductivity gallium nitride (GaN) layer 12 about 0.5 $\mu$m thick on the surface 13 of the substrate. An epitaxial single crystalline layer 14 of $Al_xGa_{1-x}N$ is next grown onto the surface of layer 12 with the value of x selected so as to provide the appropriate long wavelength cutoff. Cesium is next evaporated onto the surface in a very thin layer, 15, approximately one monoatomic layer thick. The layer 14 thickness is chosen to maximize photon absorption while also maximizing the fraction of the photoexcited electrons that can diffuse to the cesium escape surface before being lost to recombination. The x value selected for layer 14 can be controlled as desired by adjusting the gas flow rates of the several gases during growth. In one embodiment we grow the active $Al_xGa_{1-x}N$ layer with an x value of about 0.35 which puts the cutoff wavelengths at 290 nm. The GaN epitaxial layer and the $Al_xGa_{1-x}N$ epitaxial layer may each be in the thickness range of about 100 nm to about 1000 nm.

Negative electron affinity action has been developed and used for high quantum efficiency photocathodes in such materials as p-type GaAs and $In_xGa_{1-x}As$. The critical condition that must be met, however, is not p-type conductivity but rather that the energy difference between the Fermi level and the conduction band of the semiconductor be equal or greater than the work function of cesium. Negative electron affinity action occurs in this device when photons of energy equal or greater than the semiconductor bandgap energy are absorbed near the surface of a cesiated semiconductor and produce free electrons in the conduction band. The electrons that diffuse from the semiconductor into the cesium are then energetically free since the conduction band in the semiconductor is at or above the vacuum level for the cesium. For GaAs this condition results, quite incidentally, in p-type conductivity since the energy bandgap in GaAs is roughly the same as the work function of cesium.

The energy bandgap of the $Al_xGa_{1-x}N$ ranges from ~3.5 eV for GaN to ~6.0 eV for AlN. Using current growth methods without the addition of acceptor doping to produce high resistivity material by compensation, the Fermi level in material of composition $X<0.3$ lies relatively close to the conduction band due to a high residual concentration of donors, for $X>0.3$ the non-deliberately doped material is increasingly insulating as a function of X. Thus for material for $X>0.3$ the application of a thin layer of cesium to the surface (by vacuum evaporation or other deposition method) will result in negative electron affinity and high photoemission efficiency. The spectral response of the photoemission will be a replication of the spectral distribution of the optical absorption near the band edge.

Figure 2:
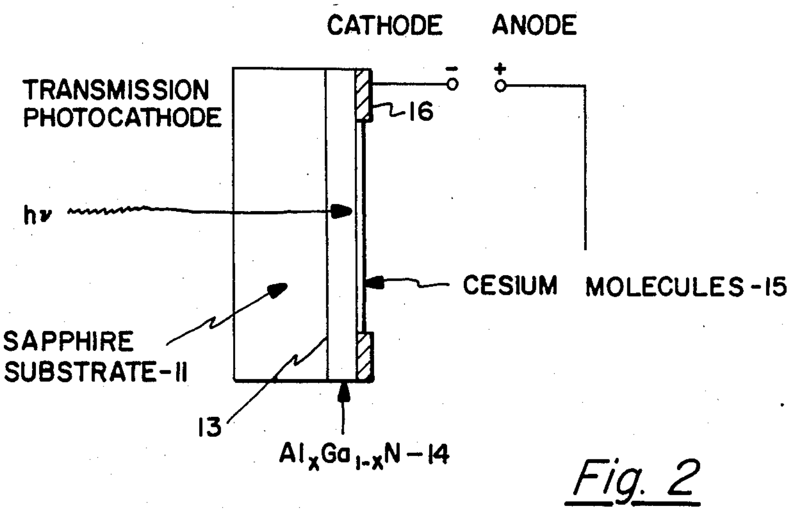
FIG. 2 is another embodiment of the photocathode and is shown as a transmission type structure.

Two embodiments are shown, one in which the photons are received at the front surface (FIG. 1) and another embodiment which is a transmission photocathode (FIG. 2) in which the radiation is received through the substrate. In FIG. 2 construction is somewhat different in that the $Al_xGa_{1-x}N$ layer 14 is epitaxially grown directly onto the sapphire substrate 11 surface 13 or onto a buffer layer of $Al_yGa_{1-y}N$ with $y>x$ so that the buffer layer is transparent to the UV radiation to be detected. A cathode connection ring conductor 16 is shown on the perimeter of the surface of the $Al_xGa_{1-x}N$ layer 14. Cesium molecules 15 are evaporated onto the surface of layer 14 as in FIG. 1.

When a UV photon is incident on the active $Al_xGa_{1-x}N$ layer either from the cesium layer side, as in FIG. 1, or the sapphire side, as in FIG. 2, it is absorbed. This absorption results in a population of free thermal electrons in the conduction band of the active $Al_xGa_{1-x}N$ material. If the thickness of the active layer is less than a characteristic electron diffusion length more than 50% of the electrons can escape from the solid photocathode structure into the vacuum where they may be collected or multiplied with well know anode structures.

The embodiments of the invention in which an exclusive property or right is claimed are defined as follows:

1. In a UV photocathode detector comprising:

a single crystalline basal plane sapphire ($Al_2O_3$) substrate having a substantially planar major surface;

a thin film epitaxial layer of aluminum gallium nitride ($Al_xGa_{1-x}N$) grown over said major surface where $x>0$; and, a monolayer thickness layer of cesium molecules evaporated over said $Al_xGa_{1-x}N$ layer.

2. The detector according to claim 1 in which said $Al_xGa_{1-x}N$ epitaxial layer is in the thickness range of 100 nm to 1000 nm.

3. In a photocathode detector comprising:

a single crystalline basal plane sapphire ($Al_2O_3$) substrate having a substantially planar major surface;

a thin film epitaxial layer of high conductivity gallium nitride (GaN) grown on said major surface;

a cathode contact to said GaN layer;

a thin film epitaxial $Al_xGa_{1-x}N$ layer grown over said GaN layer where $x>0$; and, a monolayer thickness layer of cesium molecules evaporated over said $Al_xGa_{1-x}N$ layer.

4. The detector according to claim 4 in which said GaN epitaxial layer is in the thickness range of about 100 nm to about 1000 nm and said $Al_xGa_{1-x}N$ epitaxial layer is in the thickness range of about 100 nm to about 1000 nm.

* * * * *